United States Patent [19]

Sullivan

[11] Patent Number: 4,560,639
[45] Date of Patent: Dec. 24, 1985

[54] REUSABLE PHOTOTRANSPARENCY IMAGE FORMING TOOLS FOR DIRECT CONTACT PRINTING

[76] Inventor: Donald F. Sullivan, 115 Cambridge Rd., King of Prussia, Pa. 19406

[21] Appl. No.: 528,036

[22] Filed: Aug. 31, 1983

Related U.S. Application Data

[63] Continuation-in-part of Ser. No. 147,726, May 8, 1980.

[51] Int. Cl.[4] .......................... G03C 5/16; G03C 1/68; G03F 9/00
[52] U.S. Cl. ........................................ 430/273; 430/5; 430/272; 430/327; 430/270
[58] Field of Search ..................... 350/322; 430/5, 272, 430/273, 327, 270; 355/84, 100, 132, 85

[56] References Cited

U.S. PATENT DOCUMENTS

| | | | |
|---|---|---|---|
| 2,760,863 | 8/1956 | Plambeck, Jr. | 430/281 X |
| 3,573,975 | 4/1971 | Dhaka et al. | 430/327 X |
| 3,629,036 | 12/1971 | Isaacson | 96/36.2 |
| 3,837,887 | 9/1974 | Akamatsu et al. | 96/35.1 |
| 4,052,603 | 10/1977 | Karlson | 364/120 |
| 4,070,110 | 1/1978 | Ott | 355/100 |
| 4,087,182 | 5/1978 | Aiba et al. | 355/100 |
| 4,291,118 | 9/1981 | Boduch et al. | 430/313 |
| 4,292,388 | 9/1981 | Ikeda et al. | 430/5 |
| 4,298,680 | 11/1981 | Bruno | 430/327 X |

FOREIGN PATENT DOCUMENTS

| | | | |
|---|---|---|---|
| 0058017 | 8/1982 | European Pat. Off. | 430/5 |
| 2812083 | 7/1979 | Fed. Rep. of Germany | |
| 48-29727 | 9/1973 | Japan | |
| 94770 | 8/1978 | Japan | 430/5 |

OTHER PUBLICATIONS

M. Palmer, "Photomask Protection by Oleophobic Films", *IBM Technical Disclosure Bulletin*, vol. 16, No. 7, p. 2319, Dec. 1973.

Richter et al., "Comparing UV Exposure Systems for PCB's, Contact, Off–Contact and Projection Systems", *Circuits Manufacturing*, vol. 19, No. 11, pp. 69 and 117–119, Nov. 1979.

P. Z. Adelstein et al., "Manufacture and Physical Properties of Film, Paper and Plates" in *Neblette's Handbook of Photography and Reprography, Materials, Processes, and Systems*, Seventh ed., edited by John M. Sturge, Van Nostrand Reinhold Company, New York, NY, 1977, pp. 127–139.

W. S. DeForest, *Photoresist: Materials and Processes*, McGraw-Hill Book Company, 1975, pp. 19–35, 109, 213–243.

Colour Index, Third Edition, vol. 4, The Society of Dyers and Colourists, 1971, p. 4030.

*Primary Examiner*—John E. Kittle
*Assistant Examiner*—Cynthia Hamilton
*Attorney, Agent, or Firm*—Laurence R. Brown

[57] ABSTRACT

Higher resolution photoimages are produced in the photopolymer arts by intimate contact of a photoimage bearing surface of a phototransparency phototool and the surface of a liquid photopolymer layer to expose the photopolymer layer to curing radiation in that relationship. When phototools are to be reused over and over in production they are subject to wear and corresponding loss of resolution. Also the cured and hardened photopolymer tends to stick to the phototool surface. This invention resolves these problems by forming an image through a thin polyolefin film that wets with the liquid photopolymer and does not stick to such photopolymer cured and hardened thereon. Any scratching from wear, etc. causes little loss of resolution because of the through-the-film image, formed by exposing a dye and solvent solution to the porous film through an image forming stencil pattern.

6 Claims, 6 Drawing Figures

REUSABLE PHOTOTRANSPARENCY IMAGE FORMING TOOLS FOR DIRECT CONTACT PRINTING

BACKGROUND ART

This is a continuation-in-part of my copending application U.S. Ser. No. 147,726 filed May 8, 1980.

TECHNICAL FIELD

This invention relates to a photoimage process and apparatus for producing images of high fidelity on substrates, such as in the formation of conductor patterns on printed wiring boards from paste-consistency photopolymers, and more particularly it relates to phototransparency image forming tool construction and processes for producing improved low energy high resolution photopolymer images having long wear qualitites that do not lose resolution by scratching, etc. where the phototool contacts the surface of a photopolymer assembly.

Graphic images are produced on substrates, using photopolymers such as paste-consistency ultraviolet light (UV) curable photopolymers. These photopolymers are characterized by their composition of 100 percent reactive polymers, which are transformed from a paste-consistency wet film to a dry coating by exposure to a strong UV light source for several seconds. The photopolymers as used in the disclosed process are further characterized as being imaging quality, or capable of being selectively hardened by light passing through a photographic master, thereby producing a film securely affixed to a substrate, at locations where the photographic master allows the UV light to impinge on the photopolymer. These photopolymers are available commercially as plating resists and as etch resists for use in printed wiring board (PWB) manufacture, and as graphics imaging materials for example. These photopolymers are applied conventionally by screen printing through an image bearing screen stencil to deposit images on the substrates as wet photopolymer, which are then hardened and transformed into permanent images by being subjected to a strong UV light source.

The screen printed photopolymer images are characterized by large energy expenditure, heated substrates, indistinct boundaries, loss of fidelity, and smeared images.

The images which can be achieved using the disclosed process and apparatus and the same photopolymers are characterized by lines having sharp, distinct boundaries, exceptional fidelity with film thicknesses up to 0.002 inches (0.05 mm) and no smearing. For example, screen printed PWB resist patterns are practically limited to conductor widths and spacing of 0.010 inches (0.254 mm) minimum, while the same photopolymers can be imaged as disclosed herein to produce line widths and spacings of 0.003 inches (0.076 mm), with a film thickness of 0.00025 inches (0.006 mm). Screen printed half-tone images are limited to a practical upper range of 105 lines, with dot sizes of 20 to 80 percent. The same photopolymer imaged as described herein can produce half-tone graphics of 150 lines, with dot sizes of 5 to 95 percent.

Exemplary prior art for preparation of photopolymer printing plates used with phototransparency imaging includes U.S. Pat. No. 4,070,110—J. W. Ott, Jan. 24, 1978 for producing photopolymer relief printing plates in a semi-automated process. Thus a sandwich array is prepared by laminating a cover film and backing sheet with intermediate photopolymer applied in liquid form and hardened by partial exposure to light. The sandwich after being completely formed, is flattened under pressure, while exposing through the photo-transparencies. A complex machine array for a similar laminating and follow through developing process is shown also in U.S. Pat. No. 4,087,182—H. Aiba et al., May 2, 1978. These are contact printing processes as compared with a photo imaging process such as described in U.S. Pat. No. 4,052,603—K. Karlson, Oct. 4, 1977. Also, U.S. Pat. No. 3,837,887—K. Akamatsu et al., Sept. 24, 1974 provides a sandwich type printing plate for liquid photopolymers. All of these involve complex and expensive machinery and could not result in simple single pass lamination and exposure scanning as can the present invention.

All of the prior art also uses a release film layer in contact with the liquid photopolymer which is interposed between the phototransparency (or other) image to be reproduced and the photopolymer surface. Thus, there cannot be the inherent resolution available as in the present invention where the phototool comprising the photoimage surface is in direct contact with the liquid photopolymer surface when exposed to light to cure and harden the photopolymer.

One problem not overcome in the prior art is that of contacting the photopolymer surface with a reusable phototransparency image bearing surface, which may not release the photopolymer as well as for example the polypropylene release films interposed in the prior art. In reusing a prior art phototool transparency with the photoimage surface in contact, the thin photoimage is easily scratched or dirtied to ruin resolution. This is particularly true if the photoimage directly contacts a photopolymer surface which is wet or sticky and leaves residuals on the photoimage surface. These residuals can pick up dirt particles and require recleaning all of which scratches the photoimage surface. Also even when the photoimage surface is directly in contact with a plastic film protective surface over the polymer, the photoimage surface picks up dirt particles and becomes scratched. Thus, long periods of reuse of a phototool transparency that is put into direct contact with the surface of an image producing photopolymer assembly to increase resolution has not been feasible in the prior art.

DISCLOSURE OF THE INVENTION

Therefore the present invention has as a general object, the simplicity and improvement of prior art equipment and processes for producing printed elements of high resolution with liquid photopolymers, and explicitly to provide special phototransparency imaging tools particularly adapted to produce images with liquid photopolymers.

Thus the photopolymers are applied as a layer in the wet state and converted to a hardened polymerized image state by exposure to light through specially formulated phototransparencies. One objective is to provide a significant improvement in attained image resolution over known competing imaging processes.

Another objective is to provide phototransparency techniques interrelating with liquid photopolymers to greatly reduce the total cost of image formation, to permit use of less expensive equipment and less expensive photopolymer, to provide improved resolution images and to increase the productivity of personnel.

By excluding air from the liquid photopolymer during the photo exposure step by sandwiching the polymer between two layers one of which carries a phototransparency image, exposure time is decreased, energy is decreased, speed of production is increased, temperature is decreased and resolution is improved.

By contacting the phototransparency image directly with the liquid photopolymer surface, the described processes and apparatus are capable of providing increased resolution images with a film thickness of between 0.25 thousandth of an inch (0.006 mm) and over 2 thousandths of an inch (0.05 mm). However, when certain types of transparency images are to be reused, they may lose resolution by scratching or by accumulating noise in the form of unremoved or partly cured photopolymers. Thus, the phototools comprising image reproducing photo-transparencies are specially processed in this invention to provide improved resolution, longer life and synergetic relationships with liquid photopolymer layers.

In particular this invention provides images on photopolymer release surface contact films such as polypropylene, so that repeated stripping and reuse of image bearing phototools from a liquid polymer surface after exposure and hardening may occur without decreasing resolution capabilities due to scratching, damage to the image or accumulation of hardened photopolymer.

One feature of the invention provides for a phototool having the image extending into the body of the release surface contact film thereby to withstand scratching and wear. This phototool is produced by a novel method of dying the surface contact film to form the image pattern to be reproduced.

BRIEF DESCRIPTION OF THE DRAWINGS

Further background, objects, advantages and features of the invention will be set forth throughout the following specification with reference to the accompanying drawings wherein.

DESCRIPTION OF PREFERRED EMBODIMENTS

Figure 1:
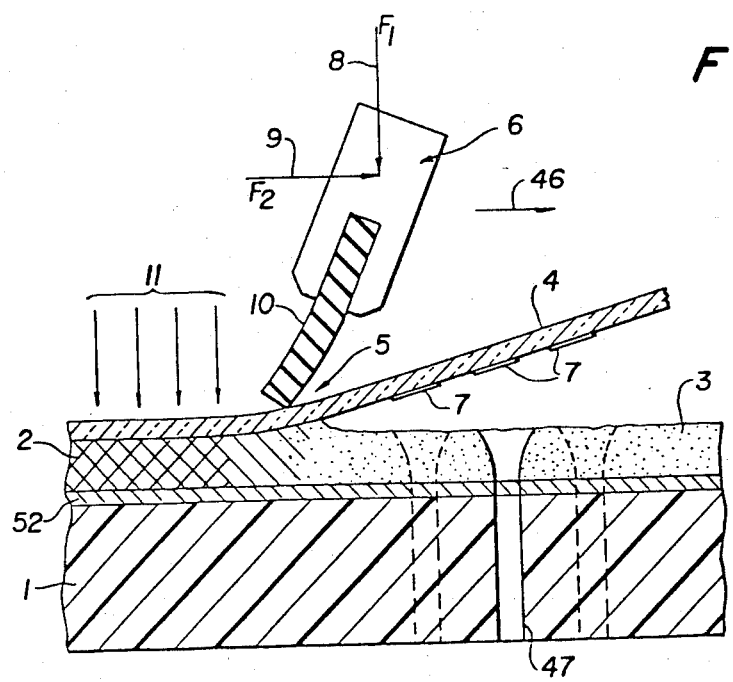
FIG. 1 is a diagrammatic side view sketch, partly sectioned to illustrate the mating of a photoimage with a coated substrate by use of a resilient blade as provided by this invention.

Computer grade PC boards are typically manufactured in panel form in sizes of the order of 18 by 20 inches (0.46 M by 0.5 M). Conductor lines and spaces are of the order of 0.010 inches wide ( 0.025 cm) with sharply defined edges, free of nicks and bulges. Additionally, the imaging resist forming the conductors must maintain a constant thickness, consistent with the plating or etching chemicals, temperature and immersion time. Too thin a resist results in breakdowns and the plating of metal at unwanted locations.

With regard to image placement on the copper-clad board, the 18 by 20 inch (0.46 M by 0.5 M) panel will typically have an accuracy of 0.002 inches (0.05 mm) on drilled hole location, requiring that the imaging be accurate to within 0.005 inches (0.13 mm) in order to maintain an annular ring of the order of 0.005 inches (0.13 mm) around the hole.

As described earlier, the UV curable photopolymers used in PWB manufacture have been developed to be applied by screen printing over the copper surface and cured by conveying under 200 watt-per inch mercury vapor lamps at a speed of 12 feet (3.66 M) per minute. The surface temperature rise is significant, for the board receives approximately 200 watt-seconds of energy per square inch of area. Typically, surface temperatures in excess of 300 degrees F. are experienced. The aforementioned 200 watt-seconds per square inch (6.45 cm$_2$) energy requirement is for photopolymer with surface exposed to air. However, most all of the tested photopolymers are affected by air to the extent that the exposure energy can be reduced to only 50 watt-seconds per square inch (6.45 square cm) when the air is completely excluded by the mating process described herein.

Phototool Mating

A phototool, as used herein, is a transparent sheet with light opaque areas corresponding to the image to be reproduced, and this phototool is placed between the UV lamp and the substrate to control those areas of photopolymer to be hardened. The terms photoimage, photomask and phototool can be used interchangeably.

While it is possible to image the coated PWB with the phototool off-contact, it is not cost-effective, since an expensive collimated light source is required; other light sources will produce light undercutting, reduced line widths, and loss of line fidelity. In order to use a non-collimated light source and still achieve fine line imaging, it is necessary for the phototool image bearing surface to intimately contact the photopolymer, as is accomplished herein.

FIG. 1 shows a section of a PWB 1 in which the phototool is being mated to the coated surface 3. PWB 1 has been previously roughly coated with photopolymer layer 3. Phototool 4 is positioned above and off contact with PWB 1 with opaque areas 7 registered to drilled holes 47 in the PWB 1. Assembly 6 movable in the direction of arrow 46 has rubber blade 10 of 50 durometer, which traverses the top surface of phototool 4. Force $F_1$ in direction 8 on phototool 4 causes the phototool to contact the photopolymer and force $F_2$ in the direction of movement 9 causes blade 10 to traverse the topside of the phototool and progressively mate the phototool with the photopolymer. This technique purges the photopolymer of air bubbles which may have been entrapped during the coating cycle, and also prevents the entrapment of air resident between the phototool and photopolymer surface.

This mating technique has several highly desirable features not readily obtainable otherwise. First, the photopolymer surface, when coated, may be mottled or have an orange-peel effect. These surface irregularities are smoothed out and the mated surface conforms to the smooth plastic surface topology of phototool 4 as well as the substrate. In the case of a PWB the substrate carries a copper layer 52 surface which is to be conformed to the image of the phototool 4, for example. This is illustrated in FIG. 1 with crosshatched photopolymer area 2 being in surface to surface contact because of the previous scanning of surface contact member 10, preferably a rubber blade, across the phototool 4 surface.

On those areas of the phototool now mated with the (crosshatched) photopolymer, a strong holding force is maintained between the phototool and PWB surface. Thus, atmospheric pressure 11 (FIG. 1) maintains the phototool in intimate contact with the photopolymer surface indefinitely, without an outside vacuum source. Phototool opaque areas 7 (which usually do not constitute surface irregularities) are in intimate contact with the photopolymer surface, and the photopolymer can be exposed with a non-collimated light source and produce high fidelity reproduction of images on the phototool on the PWB plating resist pattern.

Figure 2:
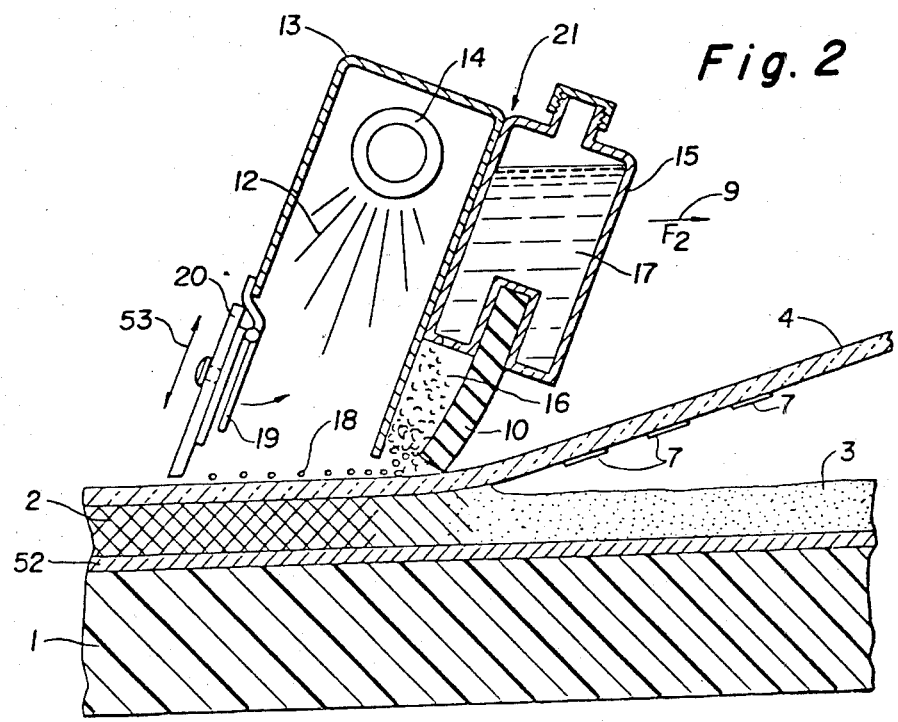
FIG. 2 is a further similar sketch illustrating the mating during an exposure step wherein a coolant dispenser and tubular lamp are co-mounted to protect the photoimage from excess heat and to expose the photopolymer all on one scan.

FIG. 2 shows a preferred method for curing photopolymer 3. For this purpose, UV lamp 14 and reflector-focuser 13 are mounted on the same movable transversing assembly 21 as blade 10. After the blade causes the phototool to mate with the photopolymer, light rays 12 expose and polymerize the photopolymer layer 2 directly beneath the phototool transparent areas. Light rays 12 cannot expose those areas ahead of blade 10.

FIG. 2 shows the coolant dispensing apparatus; reservoir 15, supplying coolant 17 to sponge 16 and thence to phototool 4 in a film shown as droplets 18. Shuttering is accomplished automatically by pivoted shutter 19 as the assembly 21 is lowered into contact with phototool 4. Light shroud 20 contacts phototool 4 and slides upward along the reflector-focuser 13, and actuates the pivoting shutter 19 which opens to expose the mated photopolymer. Arrow 53 shows the reciprocal movement of the transversing assembly to move from rest into engagement on transversal and then back into a spaced separation position from the photopolymer layer 3.

FIG. 2 shows 3 distinct zones or conditions of photopolymer. Photopolymer 2 under lamp 14 is polymerized as shown by crosshatching, while photopolymer 2 under sponge 16 is under vacuum but not yet exposed as indicated by lining; photopolymer 3 is not yet contacted by phototool 4 and is therefore at atmospheric pressure as indicated by dotting. This progressive exposure method is an advancement in the art of producing printed plates with photopolymers, since present systems require a time of several seconds for drawdown of the entire phototool before the exposure beings as for example in the aforementioned U.S. Pat. No. 4,070,110. Similarly vacuum drawdown techniques are costly and time consuming. Since the disclosed system requires no external vacuum and exposes during scanning, this drawdown period and equipment is eliminated.

The preferred liquid photopolymer is product number 1075 UV curable photopolymer manufactured by the M&T Chemical Company of Rahway, New Jersey. This is a negative acting polymer hardening in light struck areas and remaining liquid in opaque image marked unexposed areas. The unexposed liquid photopolymer is washed out in a 50% solution of isopropyl alcohol and trichlorcethane These photoresists have been developed to be screen printed to a thickness of 1 to 2 thousandths of an inch (0.025 mm to 0.05 mm), and cured by a two-lamp assembly, each lamp rated at 200 watts per linear inch (2.54 cm), with a conveyor speed of 12 feet per minute. With the disclosed equipment the phototool is placed between the lamp and PWB, subjecting the phototool to temperature ranging up to 300 degrees F. The phototool temperature can be reduced to less than 100 degrees F. by utilizing a different lamp source and increasing the exposure time to the order of 40 seconds. One embodiment using a polyester sheet has a high temperature silicone rubber release layer to bond the opaque areas 7 (FIG. 1) to the sheet 4. This prevents the phototool from adhering to the cured and hardened image to damage the image bearing surface in direct contact with the liquid photopolymer layer during exposure. The silicone rubber layer is very thin and therefore does not seriously limit resolution available.

The Image Bearing Phototool

Referring to FIG. 1, phototool 4 is seen to be subjected to a horizontal force 9 which tends to stretch the phototool and thereby introduce registration errors. Polyester sheet in the thickness of 4 to 8 thousandths of an inch (0.1 to 0.2 mm) provides the stability needed by the phototool, plus the ability to withstand short temperature excursions to 250 degrees F. Phototool opaque areas consist of etched metal foil, preferably aluminum.

To make a phototool, a sheet of clear polyester and a thin sheet of aluminum foil are laminated together, with a thin layer of clear silicone rubber adhesive bonding the two securely. The foil is given a pre-etch in sodium hydroxide in order to reduce the foil thickness to the order of 0.0001 inch (0.0025 mm). The foil is then coated with a photographic etch resist, exposed, washed out and then etched again to produce the phototool image in etched foil.

Etched aluminum foil is preferred over other black emulsion systems since a large area of black emulsion would absorb large quantities of heat which could distort the phototool, while the aluminum surface reflects heat and reduces the total amount absorbed.

Figure 3:
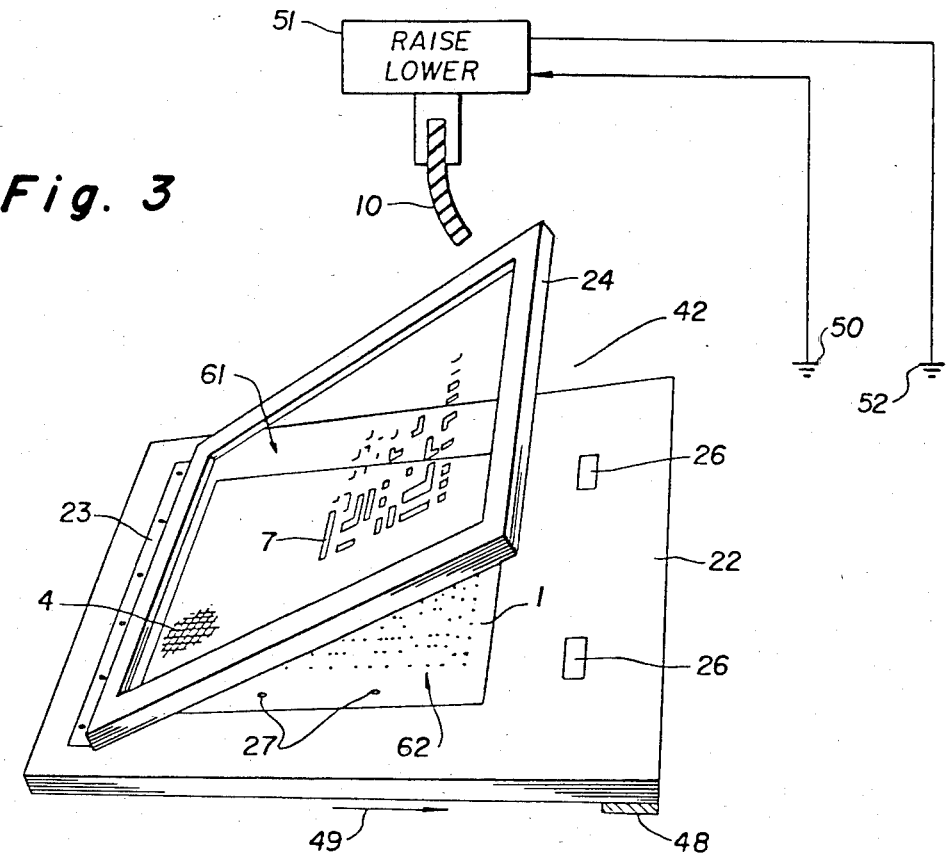
FIG. 3 is a perspective sketch of a fixture for mounting the photoimage and the substrate in register prior to being mated together with schematic control features.
Figure 4:
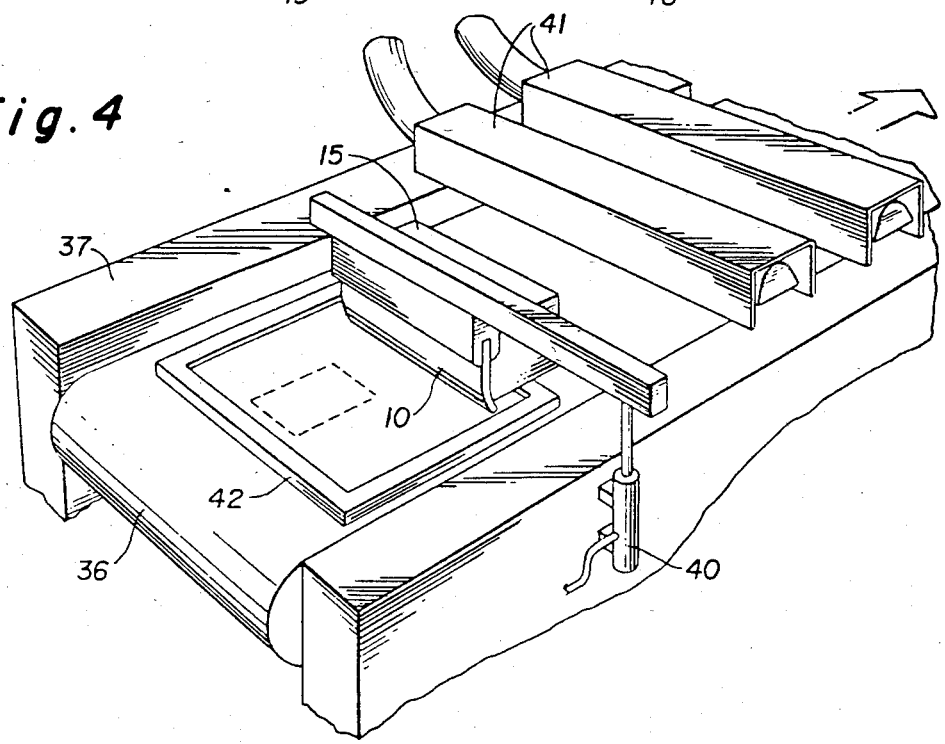
FIG. 4 is a perspective fragmental view of a simple unit for laminating and exposing a photopolymer containing sandwich array in accordance with the invention.

For use in this invention the phototool with bonded foil is stretched in phototool frame 24, FIG. 3, coated and inserted into the apparatus of FIG. 4. Exact registration between the phototool pattern and substrates to be imaged in production is achieved by placing a production substrate onto the substrate mounting plate 22 in register such as by use of registration pins 27. Next the master artwork is placed in frame 24 over the substrate in exact register. The mounting plate is secured to the phototool frame as in FIG. 3 in register by means of hinge 23. The resilient blade 10 is drawn across the polyester sheet 4 which was previously developed from an artwork master and photopolymer coated polyester sheet, thereby transferring the artwork in the form of a foil surface 7.

The flexible polyester sheet phototool 4 is coated over the foil surface with silicone rubber adhesive, Dow Corning product code 734 RTV, which serves two major functions. First, the resilient rubber can accommodate small dirt particles on the PWB surface. During the mating cycle PWB surface irregularities can cause a separation to exist between the phototool and PWB surface which will mar the image over a much wider area than the irregularity itself. The silicone rubber, being resilient, conforms to the irregularity and reduces the marred area. Secondly, the silicone rubber adhesive forms a non-stick surface on the phototool to which hardened photopolymer will not adhere.

The phototool can also be made from polyester photographic film having either a silver halide emulsion or a diazo emulsion, with a suitable non-stick surface added. The aforementioned heat build up in large opaque areas may distort and damage this type of phototool.

Thus far in this disclosure, the use of a flexible phototool has been described. The phototool need not be flexible in all cases. For example, when imaging flexible printed wiring circuits, the phototool may be a glass plate and the flexible substrate mated with the phototool by drawing the blade across the flexible substrate. Thus, in the frame of FIG. 3, simply the substrate and phototool are interchanged in position. The photo scanning need then occur on the opposite side.

FIG. 3 shows a fixture for mounting the phototool and PWB in register and off contact, for use when precise registration is required, when a conveyorized UV curing unit is used as the exposure source, or when a preregistered fixture is needed.

In the fixture 42, PWB 1 mounts on base 22 and is registered via pins 27. Phototool 4 is mounted on frame 24 which maintains the phototool in registration with drilled PWB 1. Hinge 23 allows frame 24 to be raised and lowered for placement and removal of PWB 1. Spacers 26 maintain off-contact distance between phototool 4 and PWB 1 top surface.

In FIG. 3, mounting base 22 has a metal strip 48 affixed to the underside, whose purpose is to cause the generation of an electrical signal when the exposure assembly is conveyed in direction 49 past a sensor 50 serving to actuate a lowering mechanism at control center 51 for positioning the mating blade 10. A similar electrical signal at 52 will in turn cause the mating blade to rise. Thus contact of the phototool at the leading edge of the image area with the blade 10 is automated. Also the signal at sensor 52 will also cause the blade to be raised automatically at the trailing edge of the image area.

Imaging Sequence

The following chart shows the process steps of this invention to be followed where hole tenting is not required.
 a. prepare the phototool and install in the fixture.
 b. coat the drilled PWB or the phototool with paste photopolymer.
 c. install PWB in registration on the fixture.
 d. mate the phototool with the PWB to form a sandwich.
 e. expose the PWB to UV light through the phototool.
 f. separate the phototool from the PWB leaving hardened photopolymer on PWB.
 g. wash out unexposed paste photopolymer on PWB and post cure if desirable.
 h. blot the phototool to remove any photopolymer paste adhering thereto, and reinstituting the cycle.

The PWB is coated, Step b, by screen printing to the desired thickness, normally from 0.5 to 2 thousandths of an inch (0.013 mm to 0.051 mm), as determined by plating bath requirements (temperature, immersion time, plating current density and chemical composition), and the plating thickness to be deposited. The photopolymer thickness is controlled primarily by the screen fabric thickness and percent open area. For example, a 156 mesh polyester fabric will coat the PWB to a thickness of approximately 1 mil (0.25 mm), while a 230 mesh fabric will deposit a coating 0.3 mils (0.076 mm) thick. The phototool is maintained off-contact, but correctly positioned above the coated PWB by the fixturing as shown in FIG. 3. Off contact distance is of the order of 0.060 inches (0.15 cm) for a 12 by 18 inch (0.3 by 0.46 M) PWB. The phototool is mated with the coated PWB by pressing the blade down at one end of the PWB and drawing the blade across the PWB length, using a downward force of 2 pounds (0.9 Kg) per linear inch (2.54 cm) of blade length.

The washout of unexposed photopolymer, Step f, is accomplished by using a solvent spray bath, for example trichloroethane, lasting from 10 to 30 seconds.

Step h, the blotting of the underside of the phototool is required to smooth out unexposed photopolymer which remains on the phototool after the exposed PWB is removed. If left on the phototool, then the next image may be marred by the presence of entrapped air. Usually it is necessary to blot the phototool after every second or third exposure cycle, depending on the photopolymer coating thickness on the PWB. Blotting is accomplished by use of a rubber roller to obliterate the patterns and distribute the remaining photopolymer more evenly.

Where selected holes are to be tented by the photoimaged resist, the primary difference in the procedures for hole tenting is Step b, in which the phototool is coated rather than the PWB.

Another difference is that blotting the phototool is not necessary when tenting, since the step b step, phototool coating, obliterates the residual photopolymer patterns.

As described earlier, the phototool has a thin layer of clear silicone rubber on the underside. When a coating of photopolymer is applied by screen printing (or other means) onto the silicone rubber, the photopolymer will develop "fish-eyes" or voids which will continue to expand in area with time. This is caused by the inability of the wet photopolymer to grip the silicone rubber, and the photopolymer surface tension causes the photopolymer to form beads, similar to the beading of water on a waxed surface.

In order to prevent the formation of fish-eyes or voids, the disclosed apparatus exposes or flashes the photopolymer through the phototool as the coating is being applied. This flashing step is of sufficient intensity to slightly polymerize the photopolymer over the clear areas of the phototool, but not to the point of exterior surface hardening. That photopolymer above the phototool opaque areas need not be flashed.

It would appear that this flashing step is critical with regard to lamp intensity and exposure time, but in practice it is not. The photopolymer listed in this disclosure, and all photopolymers tested are air-inhibited, meaning that the photopolymer cure with less UV energy in the absence of air than is required in the presence of air. Thus, as the phototool is coated with photopolymer via screen printing, only a thin line of photopolymer immediately under the squeegee is deprived of air, for the screen fabric is off-contact, and touches the phototool only along a line underneath the squeegee. Previously deposited photopolymer, though exposed, will retain a wet surface for good adhesion to the substrate to be printed.

This flashing technique is an important aspect of tenting holes in PWB resist imaging, for the flashing ensures a thicker film over the tented hole than would be attained without flashing, for without flashing the photopolymer would thin out at the edges of the holes and would be more likely to break down during washout and immersion in the plating solution.

This flashing step has produced a polymerized image which is hardened on the phototool side, but wet on the exterior side, so that the next step of phototool mating with the substrate can be considered to be an image transfer technique.

Mating and Exposing Apparatus

In arriving at the preferred embodiment substrates were imaged using three available production equipments modified as described. While these alternates do not provide the capability for coating, mating and exposing as readily as the preferred embodiment, they have high production capacities or other merits.

A substrate can be coated via screen printing, placed in the exposure fixture and imaged with a modified conveyorized UV curing unit, consisting of horizontal tubular UV lamps with a conveyor belt for moving substrates under the lamps. These UV curing units can be used for producing images per this disclosure by the addition of a mating blade assembly and phototool coolant-dispensing apparatus as shown in FIG. 4.

Conveyor belt 36 conveys the phototool assembly 42 under blade 10. Blade 10 is pulled downward by vacuum cylinders 40, for a period of time beginning when the leading edge of metal strip on the bottomside of phototool assembly 42 bridges electrical contacts mounted under conveyor belt 36. The conveyor belt on most UV curing units are made of fiberglass mesh encased in a heat resistant plastic, enabling the filaments comprising the electrical contacts to extend thru the mesh and contact the blade control strip. This action permits precise control of the blade and prevents the blade from striking the leading or trailing edge of the phototool frame. Co-mounted with blade 10 is reservoir 15 containing the phototool coolant which is dispensed by a sponge not shown in FIG. 4.

Special phototools used for producing high resolution photoimages with photopolymer resins are produced by engaging the photoimage bearing surface of an image bearing phototransparency directly with the surface of a liquid photopolymer. This results in special conditions and requirements not heretofore necessary, particularly when it is desired to use phototools over and over in production quantities.

Thus the surface in contact with the liquid photopolymer must be wetted to prevent beading or air bubbles, which is inconsistent with the requirement to prevent adherence to the hardened photopolymer images cured on the phototool-image bearing surface, the removal of all cured materials from the phototool and the lack of interference of residual liquid photopolymer on the phototool surface after stripping from the developed image. This invention therefore provides a phototool with an image bearing surface meeting these requirements by dying through a very thin plastic film of the group constituting polyethylene and polypropylene.

This process takes advantage of the film porosity to expose an image pattern through a blocking stencil on the film surface to a solution of dye and solvent that evaporates and penetrates the film pores by absorption to dye the film permanently. The stencil can then be removed to have a phototool not hurt by surface scratching or wear. The dye may be a product sold as "Atlasol" Golden Yellow by Atlantic Chemical Corp. of Nutley, N.J. in a solution with butyl cellusolve solvent identified as C.I. Solvent Yellow 14 (Colour Index Number 12055).

The stencil may be photo formed on a thin film of liquid photopolymer on the contact surface of the film imaged by a phototransparency through the thin polypropylene, etc. film layer overlaminating the phototransparency image bearing surface and held in place by a thin pressure sensitive adhesive layer. Since the dye patterns extend through the film and are substantially identical to those patterns on the phototransparency, no undercutting will occur during exposure and there is a scratch proofed finish because the dye extends through the film thickness. Non-collimated light thus may be used for exposure without resolution loss.

This layer as is the case with the aforesaid aluminum image, does not heat as does silver halide dark surface, but is opaque to the UV curing radiation. Polyolefin film and particularly polypropylene film because it is clear, porous and has the desired sticking properties is a preferred release coating rather than the aforesaid silicone coatings.

Use of this release type film as an intervening layer without carrying the image cuts down resolution significantly, and needs be used only with collimated light, which is expensive.

An alternate method for achieving the dyed pattern is to combine into a single liquid the preferred "1075" photopolymer, the butyl cellosolve and the dye. This composite is sprayed over the surface of the polypropylene film and selectively exposed through the phototransparency and through the polypropylene film. Light struck photopolymer is hardened, immobilizing the dye particles. Non-light struck photopolymer remains in the liquid state and while the solvent is being evaporated dye particles are absorbed into the pores of the polypropylene. An alternate porous film which can be used in the disclosed process is polyethylene. However, polyethylene does not have the clarity nor high-temperature service range as polypropylene.

Figure 5:
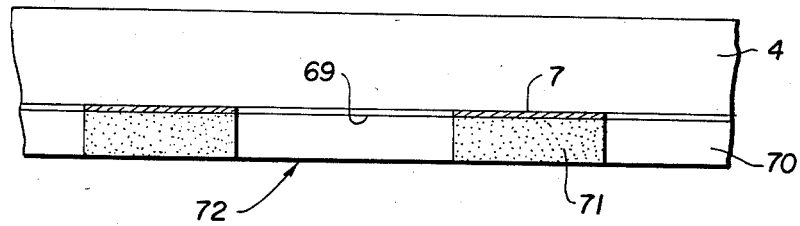
FIG. 5 is a diagrammatic side view sketch of an image bearing phototool embodiment of the invention.
Figure 6:
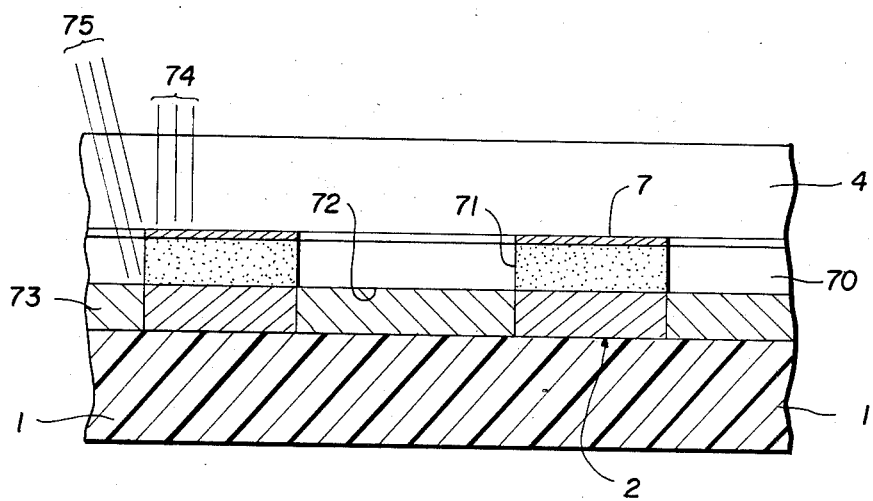
FIG. 6 is a diagrammatic side view sketch of a further image bearing high resolution phototool embodiment of the invention, with a photoimage bearing surface in easily releasable contact with the liquid photopolymer surface.

This latter advantageous phototool product and method is better understood by reference to FIGS. 5 and 6 of the drawing. As may be seen the photo-transparency film 4 with opaque aluminum images 7 on image bearing surface 69 have over-laminated thereon the thin polypropylene film sheet layer 70, wherein the sections 71 are dyed in the manner aforesaid to extend through the entire thickness of film layer 70.

In FIG. 6 the surface 72 is wetted by liquid photopolymer of layer 73 into which the surface 72 is merged as before described in an air free surface contact. Furthermore, surface 72 does not adhere to exposed, cured and hardened thereon photo cured polymer sections 2 of the photopolymer film layer 73 on substrate 1. Thus, the phototool comprising layers 4 and 70 may be stripped for developing the photoimage on substrate 1 by washing out the liquid uncured parts of the layer 73 in a solvent to provide a photoimaged product, such as a printed wiring board pattern or solder mask thereover, etc., of highest resolution. The stripped phototool is then preferably blotted to smooth out any of the unexposed liquid photopolymer of layer 73 that sticks thereon. This is not necessary in the event the liquid photopolymer layer is positioned on the flexible phototool layer surface 72 by silk screening or the like in a very thin layer of known thickness.

Note in particular very good resolution is retained without collimated light because of the dyed through sections 71 in the polypropylene (etc.) film layer 70 which block rays 75 not collimated as rays 74 are, which would be necessary to save the high resolution if release film layer 70 were interposed without the photoimage dyed through feature of this invention.

Thus, for the first time in the art a photo-transparency image forming tool is produced which gives highest resolution because of direct surface contact with the surface of a phototransparency assembly whether it be a liquid polymer, a tacky surface of a dry film polymer or a surface protected by a thin release layer of transparent film such as polypropylene, and yet can be used over and over in industrial reproduction use. Because the image bearing surface has a non-stick release layer of transparent polypropylene film, or the like, with the image extending into the film, considerable scratching and wear from repeated use may occur without significant loss of high resolution printing.

Having therefore set out the construction and operation of a preferred embodiment of the invention and advanced the state of the art, these features of novelty believed descriptive of the spirit and nature of the invention are set forth with particularity in the appended claims.

Industrial Application

There is provided an improved process and apparatus for making precision photoimages particularly useful in the production of printed wiring circuits, where a resist image is put on a copper-clad board to limit the plated metal to those areas which will become electrical conductors.

Thus, a UV curable photopolymer of paste-consistency is applied over the board surface and selectively exposed through a special phototool in contact with the wet photopolymer, producing a hardened resist pattern which withstands the subsequent solvent wash-out step.

Additionally, the disclosed process and apparatus provides an improvement in resolution and permits high quality in half-tone dot printing, particularly for substrates heretofore imaged by screen printing, and production equipment for mass production of printed wiring boards or other photoprinted products.

For the first time in the art, a photo-transparency image forming tool is provided which produces very high resolution by means of contact printing but can be reused over and over again without significant loss of resolution because of its scratch resistant features achieved by dying the image into the polypropylene (or the like) release film body thereby eliminating a thin surface image that is damaged by wear and scratching.

I claim:

1. A phototransparency image bearing phototool assembly comprising in combination,
   a two-sided transparent supporting body sheet forming an outer sandwich layer with a surface on one side to be disposed innermost, a photo-imageable assembly adjacent the innermost said surface of said sheet comprising an inner uncured photopolymer layer,
   a transparency image disposed on said innermost side adapted to expose in said polymer layer a corresponding image in response to radiation passed thereto by way of said transparent body,
   and release surface structure on said transparency image surface for contacting said photopolymer layer of the photopolymer assembly without adhering to a photopolymer image cured in place in said polymer layer by said radiation with the transparency image extending through the release surface structure.

2. A phototool assembly as defined in claim 1 wherein the transparency image is disposed in a polypropylene film layer, and said release surface structure consists of the polypropylene film surface.

3. A phototool assembly as defined in claim 1 with a polypropylene film layer, said release surface structure consisting of the polypropylene surface, with a phototransparency image disposed in the polypropylene film layer.

4. A phototool assembly as defined in claim 1 wherein said supporting body is a flexible sheet.

5. A phototool assembly as defined in claim 1 wherein the release surface structure comprises a surface on a plastic film of the group consisting of polyethylene and polypropylene, and the image is formed in the film by a dye absorbed by the film.

6. The phototool assembly defined in claim 1 wherein the photopolymer layer is a liquid layer to be hardened and cured by exposure to radiation, and the transparency image is in direct air free contact with the liquid photopolymer layer.

* * * * *